United States Patent
Moon et al.

(10) Patent No.: US 10,656,459 B2
(45) Date of Patent: May 19, 2020

(54) COLOR POLARIZING FILM, ANTIREFLECTIVE FILM, AND DISPLAY DEVICE

(71) Applicants: SAMSUNG ELECTRONICS CO., LTD., Suwon-si, Gyeonggi-do (KR); Samsung SDI Co., Ltd., Yongin-si, Gyeonggi-do (KR)

(72) Inventors: Deuk Kyu Moon, Seoul (KR); Yong Joo Lee, Suwon-si (KR); Boreum Jeong, Daejeon (KR); Myungsup Jung, Seongnam-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/435,939

(22) Filed: Feb. 17, 2017

(65) Prior Publication Data

US 2017/0242297 A1     Aug. 24, 2017

(30) Foreign Application Priority Data

Feb. 22, 2016    (KR) ........................ 10-2016-0020857

(51) Int. Cl.
    *G02F 1/1335*      (2006.01)
    *H01L 27/32*      (2006.01)
    (Continued)

(52) U.S. Cl.
    CPC ......... *G02F 1/133533* (2013.01); *G02B 1/08* (2013.01); *G02B 5/305* (2013.01);
    (Continued)

(58) Field of Classification Search
    CPC ............... C08J 2323/12; C08J 2323/14; C09B 67/0097; G02F 1/133533; H01L 27/322;
    (Continued)

(56) References Cited

U.S. PATENT DOCUMENTS 4,025,164 A * 5/1977 Doriguzzi ......... G02F 1/133533
    349/97
5,751,483 A * 5/1998 Itoh ...................... G02B 5/3033
    252/585
(Continued)

FOREIGN PATENT DOCUMENTS

EP      0605191 A1    7/1994
EP      2728388 A1    5/2014
(Continued)

OTHER PUBLICATIONS

Visible spectrum [online]. Wikipedia, 2018 [retrieved on Sep. 2, 2018]. Retrieved from the Internet:<URL: https://en.wikipedia.org/wiki/Visible_spectrum >. (Year: 2018).*

(Continued)

*Primary Examiner* — Sophie Hon
(74) *Attorney, Agent, or Firm* — Cantor Colburn LLP

(57) ABSTRACT

A color polarizing film including a polymer and a dichroic dye having an absorption wavelength region of about 380 nm to about 780 nm, wherein the color polarizing film exhibits a maximum absorption wavelength ($\lambda_{max}$) in a wavelength range of about 380 nm to about 780 nm is provided.

22 Claims, 6 Drawing Sheets

(51) Int. Cl.
*G02B 5/30* (2006.01)
*G02B 1/08* (2006.01)

(52) U.S. Cl.
CPC .......... *G02B 5/3033* (2013.01); *H01L 27/322* (2013.01); *C08J 2323/14* (2013.01); *Y10T 428/1041* (2015.01)

(58) Field of Classification Search
CPC ........ G02B 1/08; G02B 5/3025; G02B 5/305; Y10T 428/1041
See application file for complete search history.

(56) References Cited

U.S. PATENT DOCUMENTS

| | | | | |
|---|---|---|---|---|
| 6,028,123 | A * | 2/2000 | Hirayama | C09D 5/4411 430/280.1 |
| 6,455,163 | B1 * | 9/2002 | Okamoto | B32B 7/02 428/412 |
| 2008/0220339 | A1 * | 9/2008 | Zakrevskyy | G11B 7/244 430/2 |
| 2012/0307363 | A1 * | 12/2012 | Kozenkov | G02B 5/3016 359/487.02 |
| 2014/0016198 | A1 | 1/2014 | Sawada et al. | |
| 2014/0124714 | A1 * | 5/2014 | Lee | G02B 5/3033 252/585 |
| 2014/0126053 | A1 * | 5/2014 | Won | G02F 1/133533 359/487.02 |
| 2014/0131643 | A1 * | 5/2014 | Lee | G02B 5/3033 252/585 |
| 2014/0254012 | A1 * | 9/2014 | Moon | G02B 5/305 359/487.02 |
| 2015/0024149 | A1 | 1/2015 | Watanabe et al. | |
| 2015/0177562 | A1 | 6/2015 | Buchanan et al. | |
| 2015/0192700 | A1 | 7/2015 | Won et al. | |

FOREIGN PATENT DOCUMENTS

| | | |
|---|---|---|
| KR | 10-1078598 B1 | 10/2011 |
| KR | 2015-0082942 A | 7/2015 |

OTHER PUBLICATIONS xtended Search Report dated Jun. 26, 2017, issued for the corresponding European Patent Application No. 17156909.8-1562.
Office Action issued in EP Application No. 17 156 909.8, dated Jul. 1, 2019, 5 pp.

* cited by examiner

COLOR POLARIZING FILM, ANTIREFLECTIVE FILM, AND DISPLAY DEVICE

CROSS-REFERENCE TO RELATED APPLICATION

This application claims priority to Korean Patent Application No. 10-2016-0020857, filed in the Korean Intellectual Property Office on Feb. 22, 2016, and all the benefits accruing therefrom under 35 U.S.C. § 119, the content of which is incorporated herein in its entirety by reference.

BACKGROUND

1. Field

A color polarizing film, an antireflective film, and a display device are disclosed.

2. Description of the Related Art

A display device such as a liquid crystal display (LCD) and an organic light emitting diode (OLED) includes a polarizing plate attached to the outside of a display panel. The polarizing plate only transmits light of a specific wavelength and absorbs or reflects any other light of a different wavelength, thereby controlling the direction of incident light on the display panel or light emitted from the display panel.

The polarizing plate may be combined with a compensation film, and thus, may function as an antireflective film preventing reflection of externally incident light. The antireflective film may be formed on one side or both sides of a display device, and thus, may have an influence on visibility of the display device.

There remains a need for a polarizing film capable of realizing various reflectance colors, which improves visibility of a display device.

SUMMARY

An embodiment provides a color polarizing film capable of realizing various reflectance colors, which improves visibility of a display device.

Another embodiment provides an antireflective film including the color polarizing film.

Yet another embodiment provides a display device including the antireflective film.

According to an embodiment, a color polarizing film includes:
a polymer and a dichroic dye having an absorption wavelength region of about 380 nanometers to about 780 nanometers,
wherein the color polarizing film exhibits a maximum absorption wavelength ($\lambda_{max}$) in a wavelength range of about 380 nanometers to about 780 nanometers.

An absorption peak at the maximum absorption wavelength ($\lambda_{max}$) may have a full width at half maximum (FWHM) of less than or equal to about 300 nanometers.

The color polarizing film may realize a color even in an off-state of a display device when the color polarizing film is applied to the display device.

The polymer may be selected from a polyolefin, a polyamide, a polyester, a polyacrylate, a polymethacrylate, a styrene-based polymer, polycarbonate, a vinyl chloride-based polymer, a polyimide, a polysulfone, a polyethersulfone, a polyether-ether ketone, a polyphenylene sulfide, a polyvinyl alcohol, a polyvinylidene chloride, a polyvinyl butyral, a polyarylate, polyoxymethylene, an epoxy polymer, a copolymer thereof, and a combination thereof.

The dichroic dye may include one dichroic dye or more dichroic dyes having the same or different absorption wavelength regions.

The dichroic dye may include at least one selected from a first dichroic dye (A) having a maximum absorption wavelength in a wavelength range of about 380 nanometers to about 500 nanometers, a second dichroic dye (B) having a maximum absorption wavelength in a wavelength range of greater than about 500 nanometers and less than or equal to about 580 nanometers, and a third dichroic dye (C) having a maximum absorption wavelength in a wavelength range of greater than about 580 nanometers and less than or equal to about 780 nanometers.

The first dichroic dye (A) may include at least one of a first dichroic dye (A1) having a maximum absorption wavelength in a wavelength range of about 380 nanometers to about 400 nanometers, and a first dichroic dye (A2) having a maximum absorption wavelength in a wavelength range of greater than about 400 nanometers and less than or equal to about 500 nanometers. The second dichroic dye (B) may include at least one of a second dichroic dye (B1) having a maximum absorption wavelength in a wavelength range of greater than about 500 nanometers and less than or equal to about 560 nanometers, and a second dichroic dye (B2) having a maximum absorption wavelength in a wavelength range of greater than about 560 nanometers and less than or equal to about 580 nanometers. The third dichroic dye (C) may include at least one of a third dichroic dye (C1) having a maximum absorption wavelength in a wavelength range of greater than about 580 nanometers and less than or equal to about 620 nm, and a third dichroic dye (C2) having a maximum absorption wavelength in a wavelength range of greater than about 620 nanometers and less than or equal to about 780 nanometers.

The dichroic dye may include a compound represented by Chemical Formula 1.

Chemical Formula 1

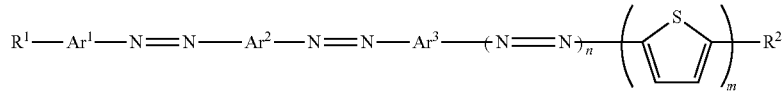

In Chemical Formula 1,
$Ar^1$ to $Ar^3$ are independently a substituted or unsubstituted C6 to C15 arylene group,
$R^1$ is selected from a substituted or unsubstituted C1 to C30 alkyl group, a substituted or unsubstituted C1 to C20 alkoxy group, a substituted or unsubstituted C1 to C20 alkylthio group, a substituted or unsubstituted C3 to C30 cycloalkyl group, a substituted or unsubstituted C3 to C20 cycloalkoxy group, a substituted or unsubstituted C3 to C20 cycloalkylthio group, —(C=O)R (wherein R is a substituted or unsubstituted C1 to C30 alkyl group or a substituted or unsubstituted C3 to C30 cycloalkyl group), —O(C=O)R (wherein R is a substituted or unsubstituted C1 to C30 alkyl group or a substituted or unsubstituted C3 to C30 cycloalkyl group), —O(C=O)OR (wherein R is a substituted or unsubstituted C1 to C30 alkyl group or a substituted or unsubstituted C3 to C30 cycloalkyl group), a substituted or unsubstituted C2 to C30 alkenyl group, a substituted or unsubstituted C2 to C30 alkynyl group, and a combination thereof, $R^2$ is selected from hydrogen, a substituted or unsubstituted C1 to C30 alkyl group, a substituted or unsubstituted C3 to C30 cycloalkyl group, a substituted or unsubstituted C6 to C20 aryl group, a substituted or unsubstituted C7 to C20 arylalkyl group, a substituted or unsubstituted C3 to C20 heteroaryl group, a substituted or unsubstituted C4 to C20 heteroarylalkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring, n is 0, 1, or 2, and m is 0 or 1.

The color polarizing film may have light transmittance of about 30% to about 85%.

The color polarizing film may include about 0.01 to about 10 parts by weight of the dichroic dye based on 100 parts by weight of the polymer, and may be made of a melt blend of the polymer and the dichroic dye.

According to another embodiment, a color polarizing film includes a first layer including a first polymer and a dichroic dye having an absorption wavelength region of about 380 nanometers to about 780 nanometers and a second layer disposed on the first layer and including a second polymer and a dye selected from a dichroic dye having an absorption wavelength region of about 380 nanometers to about 780 nanometers, a non-dichroic dye having an absorption wavelength region of about 380 nanometers to about 780 nanometers, and a combination thereof, wherein the first layer and the second layer are combined to exhibit a maximum absorption wavelength ($\lambda_{max}$) in a wavelength range of about 380 nanometers to about 780 nanometers.

An absorption peak at the maximum absorption wavelength ($\lambda_{max}$) may have a full width at half maximum (FWHM) of less than or equal to about 300 nanometers.

The color polarizing film may realize a color in an off-state of a display device when the color polarizing film is applied to the display device.

A maximum absorption wavelength ($\lambda_{max1}$) in a wavelength range of about 380 nanometers to about 780 nanometers of the first layer may be different from a maximum absorption wavelength ($\lambda_{max2}$) in a wavelength range of about 380 nanometers to about 780 nanometers of the second layer.

The second layer may be a lamination film or a coating layer.

The first polymer may be selected from a polyolefin, a polyamide, a polyester, a polyacrylate, a polymethacrylate, a styrene-based polymer, a polycarbonate, a vinyl chloride-based polymer, a polyimide, a polysulfone, a polyethersulfone, a polyether-ether ketone, a polyphenylene sulfide, a polyvinyl alcohol, a polyvinylidene chloride, a polyvinyl butyral, a polyarylate, a polyoxymethylene, an epoxy polymer, a copolymer thereof, and a combination thereof. The first polymer may include a polymer selected from polyethylene, polypropylene, polyethylene terephthalate, polybutylene terephthalate, glycol modified polyethylene terephthalate, polyethylene naphthalate, nylon, a copolymer thereof, and a combination thereof.

The second polymer may be selected from a polyolefin, a polyamide, a polyester, a polyacrylate, a polymethacrylate, a styrene-based polymer, a polycarbonate, a vinyl chloride-based polymer, a polyimide, a polysulfone, a polyethersulfone, a polyether-ether ketone, a polyphenylene sulfide, a polyvinyl alcohol, a polyvinylidene chloride, a polyvinyl butyral, a polyarylate, a polyoxymethylene, an epoxy polymer, a copolymer thereof, and a combination thereof. The second polymer may include a polymer selected from polyethylene, polypropylene, polyethylene terephthalate, polybutylene terephthalate, glycol modified polyethylene terephthalate, polyethylene naphthalate, nylon, a copolymer thereof, and a combination thereof.

The second polymer may be a hydrophobic polymer, a photocurable polymer, a thermosetting polymer, or a combination thereof. The photocurable polymer may be selected from a urethane acrylate polymer, a urethane methacrylate polymer, an epoxy acrylate polymer, an epoxy methacrylate polymer, a polyester acrylate, a polyester methacrylate, and a combination thereof, and the thermosetting polymer may be selected from a melamine polymer, a urethane polymer, an acrylic polymer, a methacrylic polymer, and a combination thereof.

The dichroic dye of the first layer may include one or more dichroic dyes having the same or different absorption wavelength regions.

The dichroic dye of the first layer may include at least one, for example, two or more, selected from a first dichroic dye (A) having a maximum absorption wavelength in a wavelength range of about 380 nanometers to about 500 nanometers, a second dichroic dye (B) having a maximum absorption wavelength in a wavelength range of greater than about 500 nanometers and less than or equal to about 580 nanometers, and a third dichroic dye (C) having a maximum absorption wavelength in a wavelength range of greater than about 580 nanometers and less than or equal to about 780 nanometers.

The first dichroic dye (A) may include at least one of a first dichroic dye (A1) having a maximum absorption wavelength in a wavelength range of about 380 nanometers to about 400 nanometers, and a first dichroic dye (A2) having a maximum absorption wavelength in a wavelength range of greater than about 400 nanometers and less than or equal to about 500 nanometers. The second dichroic dye (B) may include at least one of a second dichroic dye (B1) having a maximum absorption wavelength in a wavelength range of greater than about 500 nanometers and less than or equal to about 560 nanometers, and a second dichroic dye (B2) having a maximum absorption wavelength in a wavelength range of greater than about 560 nanometers and less than or equal to about 580 nanometers. The third dichroic dye (C) may include at least one of a third dichroic dye (C1) having a maximum absorption wavelength in a wavelength range of greater than about 580 nanometers and less than or equal to about 620 nanometers, and a third dichroic dye (C2) having a maximum absorption wavelength in a wavelength range of greater than about 620 nanometers and less than or equal to about 780 nanometers.

The dichroic dye may include a compound represented by Chemical Formula 1.

The dichroic dye of the first layer may include at least one selected from a first dichroic dye (A) having a maximum absorption wavelength in a wavelength range of about 380 nanometers to about 500 nanometers, a second dichroic dye (B) having a maximum absorption wavelength in a wavelength range of greater than about 500 nanometers and less than or equal to about 580 nanometers, and a third dichroic dye (C) having a maximum absorption wavelength in a wavelength range of greater than about 580 nanometers and less than or equal to about 780 nanometers.

The dichroic dye or the non-dichroic dye of the second layer may include at least one selected from a first dichroic dye or a first non-dichroic dye (A) having a maximum absorption wavelength in a wavelength range of about 380 nanometers to about 500 nanometers, a second dichroic dye or a second non-dichroic dye (B) having a maximum absorption wavelength in a wavelength range of greater than about 500 nanometers and less than or equal to about 580 nanometers, and a third dichroic dye or a third non-dichroic dye (C) having a maximum absorption wavelength in a wavelength range of greater than about 580 nanometers and less than or equal to about 780 nanometers.

The color polarizing film may have light transmittance of about 30% to about 85%.

The first layer may include about 0.01 to about 10 parts by weight of the dichroic dye based on 100 parts by weight of the first polymer, and may be made of a melt blend of the first polymer and the dichroic dye.

The first layer may have light transmittance of about 30% to about 85% and the second layer may have light transmittance of greater than or equal to about 30%. Herein, a ratio ($T_1/T_2$) of the light transmittance ($T_1$) of the first layer relative to the light transmittance ($T_2$) of the second layer may range from about 0.35 to about 2.9.

According to another embodiment, an antireflective film includes:
the color polarizing film; and
a compensation film.

The compensation film may be a λ/4 plate.

According to another embodiment, a display device includes:
a display panel; and
the antireflective film disposed on at least one surface of the display panel.

The display device may include an organic light emitting diode display or a liquid crystal display.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
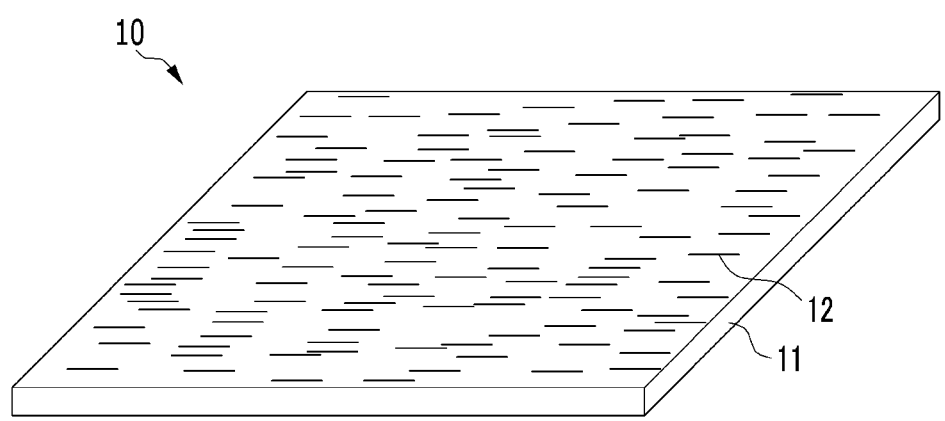
FIG. 1 is a schematic view showing a color polarizing film according to an embodiment.

Exemplary embodiments will hereinafter be described in detail, and may be easily performed by those who have common knowledge in the related art. However, this disclosure may be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise. The term "or" means "and/or." As used herein, the term "and/or" includes any and all combinations of one or more of the associated listed items. Expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Mixture" as used herein is inclusive of all types of combinations, including blends, alloys, solutions, and the like.

As used herein, the term "alkyl group" refers to a straight or branched chain saturated aliphatic hydrocarbon group having the specified number of carbon atoms and having one valence.

As used herein, the term "alkoxy group" refers to "alkyl-O—", wherein the term "alkyl" has the same meaning as described above.

As used herein, the term "alkylthio group" refers to "alkyl-S—", wherein the term "alkyl" has the same meaning as described above.

As used herein, the term "alkenyl group" refers to a straight or branched chain, monovalent hydrocarbon group having at least one carbon-carbon double bond.

As used herein, the term "alkynyl group" refers to a straight or branched chain, monovalent hydrocarbon group having at least one carbon-carbon triple bond.

As used herein, when a definition is not otherwise provided, the term "cycloalkyl group" refers to a monovalent saturated group having one or more saturated rings in which all ring members are carbon.

As used herein, the term "cycloalkoxy group" refers to "cycloalkyl-O—", wherein the term "cycloalkyl" has the same meaning as described above.

As used herein, the term "cycloalkylthio group" refers to "cycloalkyl-S—", wherein the term "cycloalkyl" has the same meaning as described above.

As used herein, when a definition is not otherwise provided, the term "aryl", which is used alone or in combination, refers to an aromatic hydrocarbon containing at least one ring and having the specified number of carbon atoms and not containing hetero atoms. The term "aryl" may be construed as including a group with an aromatic ring fused to at least one cycloalkyl ring.

As used herein, when a definition is not otherwise provided, the term "arylalkyl" refers to an aryl-substituted alkyl group, wherein "aryl" and "alkyl" have the same meaning as described above.

As used herein, when a definition is not otherwise provided, the term "heteroaryl group" refers to an aromatic group including carbon and 1 to 3 heteroatoms selected from the group consisting of N, O, S, P, and Si as ring atoms.

As used herein, when a definition is not otherwise provided, the term "heteroarylalkyl" refers to a heteroaryl-substituted alkyl group, wherein "heteroaryl" and "alkyl" have the same meaning as described above.

As used herein, when a definition is not otherwise provided, the term "arylene group" refers to a functional group having a valence of at least two obtained by removal of two hydrogens in an aromatic ring, optionally substituted with one or more substituents where indicated, provided that the valence of the alkylene group is not exceeded.

As used herein, when a definition is not otherwise provided, the term "substituted" refers to replacement of at least one hydrogen of a compound or a group by a halogen (—F, —Br, —Cl, or —I), a C1 to C20 alkoxy group, a cyano group, an amino group, a C1 to C20 ester group, a C1 to C20 alkyl group, a C2 to C20 alkenyl group, a C2 to C20 alkynyl group, a C6 to C20 aryl group, a C2 to C20 heteroaryl group, and a combination thereof.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C30 alkyl" refers to a C1 to C30 alkyl group substituted with C6 to C30 aryl group, the total number of carbon atoms in the resulting aryl substituted alkyl group is C7 to C60.

As used herein, when a definition is not otherwise provided, the term "halogen" refers to a halogen group selected from —F, —Cl, —Br, and —I, and the term "halogen-containing group" refers to a C1 to C20 alkyl group or a C6 to C20 aryl group where one or more hydrogen is replaced by a halogen group (—F, —Cl, —Br, or —I).

As used herein, when a definition is not otherwise provided, the term "hetero" refers to a functional group including 1 to 3 heteroatoms selected from N, O, S, P, and Si.

Hereinafter, referring to FIG. 1, a color polarizing film according to an embodiment is described.

FIG. 1 is a schematic view showing a color polarizing film according to an embodiment.

Referring to FIG. 1, a color polarizing film 10 according to an embodiment includes a polymer 11 and a dichroic dye 12 having an absorption wavelength region of about 380 nanometers (nm) to about 780 nm, wherein the color polarizing film exhibits a maximum absorption wavelength ($\lambda_{max}$) in a wavelength range of about 380 nm to about 780 nm.

The maximum absorption wavelength ($\lambda_{max}$) is determined when the peak is found as evidence of a full width at half maximum (FWHM) and the peak may be identified at a predetermined wavelength in the absorption graph according to the wavelength of the color polarizing film 10. In an embodiment, the full width at half maximum (FWHM) of the absorption peak at the maximum absorption wavelength ($\lambda_{max}$) may be less than or equal to about 300 nm, for example, about 100 nm to about 280 nm. While not wishing to be bound by theory, it is understood that within the above ranges, the color polarizing film 10 may realize a desirable color.

The color polarizing film 10 exhibits a maximum absorption wavelength ($\lambda_{max}$) in a wavelength range of about 380 nm to about 780 nm, and thus, realizes a color even in an off-state of a display device when the color polarizing film 10 is applied to the display device.

The dichroic dye of the color polarizing film 10 is dispersed in the polymer, and is arranged in one direction along an elongation direction of the polymer. The dichroic dye may transmit one perpendicular polarizing component of two perpendicular polarizing components in a predetermined wavelength region.

The polymer 11 may be a hydrophobic polymer, for example, a polyolefin such as polyethylene (PE), polypropylene (PP), and a copolymer thereof; a polyamide such as nylon and an aromatic polyamide; a polyester such as polyethylene terephthalate (PET), polybutylene terephthalate (PBT), glycol modified polyethylene terephthalate (PETG), and polyethylene naphthalate (PEN); a poly(meth)acrylate polymer such as polymethyl(meth)acrylate; a styrene-based polymer such as polystyrene (PS) and a (meth)acrylonitrile-styrene copolymer; polycarbonate; a vinyl chloride-based polymer; a polyimide; a polysulfone; a polyethersulfone; a polyether-ether ketone; a polyphenylene sulfide; a polyvinyl alcohol; a polyvinylidene chloride; a polyvinyl butyral; a polyarylate; a polyoxymethylene; an epoxy polymer; a copolymer thereof; or a combination thereof.

In an embodiment, the polymer 11 may be, for example, polyethylene (PE), polypropylene (PP), polyethylene terephthalate (PET), polybutylene terephthalate (PBT), glycol modified polyethylene terephthalate (PETG), polyethylene naphthalate (PEN), nylon, a copolymer thereof, or a combination thereof. In another embodiment, the polymer 11 may be, for example, a mixture of two or more selected from polyethylene (PE), polypropylene (PP), and a copolymer of polyethylene and polypropylene (PE-PP), and for another example, a mixture of polypropylene (PP) and a polyethylene-polypropylene (PE-PP) copolymer.

The polypropylene (PP) may have, for example, a melt flow index (MFI measured according to ASTM D1238) of about 0.1 g/10 min (0.1 grams per 10 minutes) to about 5 g/10 min. Herein, the melt flow index (MFI) shows the amount of a polymer in a molten state flowing per 10 min, and relates to viscosity of the polymer in a molten state. In other words, as the melt flow index (MFI) becomes lower, the polymer has higher viscosity, while as the melt flow index (MFI) becomes higher, the polymer has lower viscosity. While not wishing to be bound by theory, it is understood that when the polypropylene has a melt flow index (MFI) within the above range, workability may be effectively improved and properties of a final product may also be effectively improved. For example, the polypropylene may have a melt flow index (MFI) ranging from about 0.5 g/10 min to about 5 g/10 min.

The polyethylene-polypropylene copolymer (PE-PP) may include about 1 percent by weight (wt %) to about 50 wt % of an ethylene group based on the total amount of the copolymer. While not wishing to be bound by theory, it is understood that when the polyethylene-polypropylene (PE-PP) copolymer includes the ethylene group within above the range, phase-separation of the polypropylene and the polyethylene-polypropylene (PE-PP) copolymer may be prevented or reduced. In addition, while excellent light transmittance and alignment properties are maintained, the elongation is enhanced when the film is elongated, so the polarization characteristics of the film may be improved. For example, the polyethylene-polypropylene (PE-PP) copolymer may include about 1 wt % to about 25 wt % of the ethylene group based on the total amount of the copolymer.

The polyethylene-polypropylene (PE-PP) copolymer may have, for example, a melt flow index (MFI) of about 5 g/10 min to about 15 g/10 min. While not wishing to be bound by theory, it is understood that when the polyethylene-polypropylene (PE-PP) copolymer has a melt flow index (MFI) within the above range, workability may be effectively improved and properties of a final product may also be effectively improved. For example, the polyethylene-polypropylene (PE-PP) copolymer may have a melt flow index (MFI) of about 10 g/10 min to about 15 g/10 min.

The polymer 11 may include the polypropylene (PP) and the polyethylene-polypropylene (PE-PP) copolymer in a weight ratio of about 1:9 to about 9:1. While not wishing to be bound by theory, it is understood that when the polypropylene (PP) and the polyethylene-polypropylene (PE-PP) copolymer are included within the above range, crystallization of polypropylene may be prevented, and thus, haze characteristics may be improved while excellent mechanical strength is maintained. For example, the polymer 11 may include the polypropylene (PP) and the polyethylene-polypropylene (PE-PP) copolymer in a weight ratio of about 4:6 to about 6:4, or about 5:5.

The polymer 11 may have a melt flow index (MFI) of about 1 g/10 min to about 15 g/10 min. While not wishing to be bound by theory, it is understood that when the polymer 11 has a melt flow index (MFI) within the above range, excessive crystals are not formed in the polymer 11, and thus, excellent light transmittance may be ensured, and simultaneously, workability may be effectively improved due to an appropriate viscosity for manufacturing a film. For example, the polymer 11 may have a melt flow index (MFI) of about 5 g/10 min to about 15 g/10 min.

The polymer 11 may have crystallinity of about 50% or less. While not wishing to be bound by theory, it is understood that when the polymer 11 has crystallinity within the above range, haze may be lowered, and thus, excellent optical properties may be realized. For example, the polymer 11 may have crystallinity of about 30% to about 50%.

The polymer 11 may have light transmittance of greater than or equal to about 85% in a wavelength region of about 380 nm to about 780 nm. The polymer 11 may be elongated in a uniaxial direction. The uniaxial direction of the first polymer 11 may be the same as a length direction of the dichroic dye 12.

The dichroic dye 12 may include at least one dichroic dye, for example, a plurality of dichroic dyes having the same or different absorption wavelength regions.

The dichroic dye 12 may include at least one, for example, one or two or more of a first dichroic dye (A) having a maximum absorption wavelength in a wavelength range of about 380 nm to about 500 nm, a second dichroic dye (B) having a maximum absorption wavelength in a wavelength range of greater than about 500 nm and less than or equal to about 580 nm, and a third dichroic dye (C) having a maximum absorption wavelength in a wavelength range of greater than about 580 nm and less than or equal to about 780 nm.

Herein, the dichroic dye 12 may include at least one dichroic dye selected from each first dichroic dye, each second dichroic dye, and each third dichroic dye.

The first dichroic dye (A) may include at least one of a first dichroic dye (A1) having a maximum absorption wavelength in a wavelength range of about 380 nm to about 400 nm and first dichroic dye (A2) having a maximum absorption wavelength in a wavelength range of greater than about 400 nm and less than or equal to about 500 nm. The second dichroic dye (B) may include at least one of a second dichroic dye (B1) having a maximum absorption wavelength in a wavelength range of greater than about 500 nm and less than or equal to about 560 nm and a second dichroic dye (B2) having a maximum absorption wavelength in a wavelength range of greater than about 560 nm and less than or equal to about 580 nm. The third dichroic dye (C) may include at least one of a third dichroic dye (C1) having a maximum absorption wavelength in a wavelength range of greater than about 580 nm and less than or equal to about 620 nm and a third dichroic dye (C2) having a maximum absorption wavelength in a wavelength range of greater than about 620 nm and less than or equal to about 780 nm.

The color polarizing film 10 may include at least one, for example, two, varieties of the first dichroic dye, the second dichroic dye, and the third dichroic dye, but it may not include all three varieties of the first dichroic dye, the second dichroic dye, and the third dichroic dye, in order to realize a desirable color. In the case of including all of the first dichroic dye, the second dichroic dye, and the third dichroic dye, a neutral gray film may be obtained. Accordingly, in order to provide a variety of colors, the color polarizing film 10 may not include all of the first dichroic dye, the second dichroic dye, and the third dichroic dye. The first dichroic dye may be a yellow dye, the second dichroic dye may be a magenta dye, and the third dichroic dye may be a cyan dye.

For example, the color polarizing film 10 may include: at least one first dichroic dye selected from the first dichroic dye (A1) and the first dichroic dye (A2) and at least one second dichroic dye selected from the second dichroic dye (B1) and the second dichroic dye (B2); at least one first dichroic dye selected from the first dichroic dye (A1) and the first dichroic dye (A2) and at least one third dichroic dye selected from the third dichroic dye (C1) and the third dichroic dye (C2); or at least one second dichroic dye selected from the second dichroic dye (B1) and the second dichroic dye (B2) and at least one third dichroic dye selected from the third dichroic dye (C1) and the third dichroic dye (C2).

The dichroic dye 12 may be, for example, an azo group-containing compound, for example, an azo group-containing compound represented by Chemical Formula 1.

stituted phenylene group, the substituted naphthalene group, and the substituted biphenylene group may be, for example, a phenylene group, a naphthalene group, and a biphenylene group substituted with a C1 to C20 alkyl group, a C1 to C20 alkoxy group, a halogen, a halogen-containing group, or a combination thereof.

For example, at least one of $Ar^1$ to $Ar^3$ may be a substituted phenylene group, a substituted naphthalene group, or a substituted biphenylene group, and for example, at least one of $Ar^1$ to $Ar^3$ may be a phenylene group, a naphthalene group, or a biphenylene group substituted with a C1 to C20 alkyl group, a C1 to C20 alkoxy group, a halogen, a halogen-containing group, or a combination thereof.

For example, at least two of $Ar^1$ to $Ar^3$ may be a substituted phenylene group, a substituted naphthalene group, or a substituted biphenylene group, and for example, at least two of $Ar^1$ to $Ar^3$ may be a phenylene group, a naphthalene group, or a biphenylene group substituted with a C1 to C20 alkyl group, a C1 to C20 alkoxy group, a halogen, a halogen-containing group, or a combination thereof.

The compound represented by Chemical Formula 1 may be a first dichroic dye having a maximum absorption wave- Chemical Formula 1

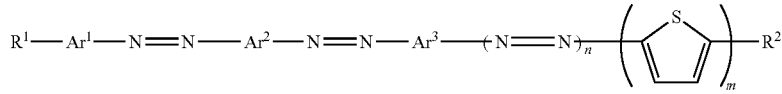

In Chemical Formula 1, $Ar^1$ to $Ar^3$ are independently a substituted or unsubstituted C6 to C15 arylene group, $R^1$ is selected from a substituted or unsubstituted C1 to C30 alkyl group, a substituted or unsubstituted C1 to C20 alkoxy group, a substituted or unsubstituted C1 to C20 alkylthio group, a substituted or unsubstituted C3 to C30 cycloalkyl group, a substituted or unsubstituted C3 to C20 cycloalkoxy group, a substituted or unsubstituted C3 to C20 cycloalkylthio group, —(C=O)R (wherein R is a substituted or unsubstituted C1 to C30 alkyl group or a substituted or unsubstituted C3 to C30 cycloalkyl group), —O(C=O)R (wherein R is a substituted or unsubstituted C1 to C30 alkyl group or a substituted or unsubstituted C3 to C30 cycloalkyl group), —O(C=O)OR (wherein R is a substituted or unsubstituted C1 to C30 alkyl group or a substituted or unsubstituted C3 to C30 cycloalkyl group), a substituted or unsubstituted C2 to C30 alkenyl group, a substituted or unsubstituted C2 to C30 alkynyl group, and a combination thereof, $R^2$ is selected from hydrogen, a substituted or unsubstituted C1 to C30 alkyl group, a substituted or unsubstituted C3 to C30 cycloalkyl group, a substituted or unsubstituted C6 to C20 aryl group, a substituted or unsubstituted C7 to C20 arylalkyl group, a substituted or unsubstituted C3 to C20 heteroaryl group, a substituted or unsubstituted C4 to C20 heteroarylalkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring, n is 0, 1, or 2, and M is 0 or 1.

In Chemical Formula 1, $Ar^1$ to $Ar^3$ may include, for example, a substituted or unsubstituted phenylene group, a substituted or unsubstituted naphthalene group, or a substituted or unsubstituted biphenylene group. Herein, the sublength in a wavelength range of about 380 nm to about 500 nm, a second dichroic dye (B) having a maximum absorption wavelength in a wavelength range of greater than about 500 nm and less than or equal to about 580 nm, or a third dichroic dye having a maximum absorption wavelength in a wavelength range of greater than about 580 nm and less than or equal to about 780 nm, in accordance with the values of n, m, $R^1$, and $R^2$.

For example, the first dichroic dye may be the compound wherein in Chemical Formula 1, n is 0 or 1, m is 0, $R^1$ is selected from a substituted or unsubstituted C1 to C30 alkyl group, a substituted or unsubstituted C1 to C20 alkoxy group, a substituted or unsubstituted C1 to C20 alkylthio group, a substituted or unsubstituted C3 to C30 cycloalkyl group, a substituted or unsubstituted C3 to C20 cycloalkoxy group, a substituted or unsubstituted C3 to C20 cycloalkylthio group, —(C=O)R (wherein R is a substituted or unsubstituted C1 to C30 alkyl group or a substituted or unsubstituted C3 to C30 cycloalkyl group), —O(C=O)R (wherein R is a substituted or unsubstituted C1 to C30 alkyl group or a substituted or unsubstituted C3 to C30 cycloalkyl group), —O(C=O)OR (wherein R is a substituted or unsubstituted C1 to C30 alkyl group or a substituted or unsubstituted C3 to C30 cycloalkyl group), a substituted or unsubstituted C2 to C30 alkenyl group, a substituted or unsubstituted C2 to C30 alkynyl group, and a combination thereof, and $R^2$ is selected from hydrogen, a substituted or unsubstituted C1 to C30 alkyl group, a substituted or unsubstituted C3 to C30 cycloalkyl group, a substituted or unsubstituted C6 to C20 aryl group, a substituted or unsubstituted C7 to C20 arylalkyl group, a substituted or unsubstituted C3 to C20 heteroaryl group, a substituted or unsubstituted C4 to C20 heteroarylalkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The second dichroic dye may be the compound wherein in Chemical Formula 1, n is 0 or 1, m is 1, $R^1$ is selected from a substituted or unsubstituted C1 to C30 alkyl group, a substituted or unsubstituted C1 to C20 alkoxy group, a substituted or unsubstituted C1 to C20 alkylthio group, a substituted or unsubstituted C3 to C30 cycloalkyl group, a substituted or unsubstituted C3 to C20 cycloalkoxy group, a substituted or unsubstituted C3 to C20 cycloalkylthio group, —(C=O)R (wherein R is a substituted or unsubstituted C1 to C30 alkyl group or a substituted or unsubstituted C3 to C30 cycloalkyl group), —O(C=O)R (wherein R is a substituted or unsubstituted C1 to C30 alkyl group or a substituted or unsubstituted C3 to C30 cycloalkyl group), —O(C=O)OR (wherein R is a substituted or unsubstituted C1 to C30 alkyl group or a substituted or unsubstituted C3 to C30 cycloalkyl group), a substituted or unsubstituted C2 to C30 alkenyl group, a substituted or unsubstituted C2 to C30 alkynyl group, and a combination thereof, and $R^2$ is selected from hydrogen, a substituted or unsubstituted C1 to C30 alkyl group, a substituted or unsubstituted C3 to C30 cycloalkyl group, a substituted or unsubstituted C6 to C20 aryl group, a substituted or unsubstituted C7 to C20 arylalkyl group, a substituted or unsubstituted C3 to C20 heteroaryl group, a substituted or unsubstituted C4 to C20 heteroarylalkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The third dichroic dye may be the compound wherein in Chemical Formula 1, n is 1 or 2, m is 1, $R^1$ is selected from a substituted or unsubstituted C1 to C30 alkyl group, a substituted or unsubstituted C1 to C20 alkoxy group, a substituted or unsubstituted C1 to C20 alkylthio group, a substituted or unsubstituted C3 to C30 cycloalkyl group, a substituted or unsubstituted C3 to C20 cycloalkoxy group, a substituted or unsubstituted C3 to C20 cycloalkylthio group, —(C=O)R (wherein R is a substituted or unsubstituted C1 to C30 alkyl group or a substituted or unsubstituted C3 to C30 cycloalkyl group), —O(C=O)R (wherein R is a substituted or unsubstituted C1 to C30 alkyl group or a substituted or unsubstituted C3 to C30 cycloalkyl group), —O(C=O)OR (wherein R is a substituted or unsubstituted C1 to C30 alkyl group or a substituted or unsubstituted C3 to C30 cycloalkyl group), a substituted or unsubstituted C2 to C30 alkenyl group, a substituted or unsubstituted C2 to C30 alkynyl group, and a combination thereof, $R^2$ is selected from hydrogen, a substituted or unsubstituted C1 to C30 alkyl group, a substituted or unsubstituted C3 to C30 cycloalkyl group, a substituted or unsubstituted C6 to C20 aryl group, a substituted or unsubstituted C7 to C20 arylalkyl group, a substituted or unsubstituted C3 to C20 heteroaryl group, a substituted or unsubstituted C4 to C20 heteroarylalkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The color polarizing film 10 may have light transmittance of about 30% to about 85%, for example, about 40% to about 85%. By having the ranged light transmittance, the polarization efficiency may be improved, without interrupting the light emission in the display device, when the color polarizing film 10 is applied to one surface of the display device.

The color polarizing film 10 may include about 0.01 to about 10 parts by weight, for example, about 0.05 to about 5 parts by weight, of the dichroic dye based on 100 parts by weight of the polymer 11. While not wishing to be bound by theory, it is understood that within the above ranges, sufficient polarization characteristics and color characteristics may be accomplished without deteriorating the light transmittance of the light polarizing film 10.

The color polarizing film 10 may be made of a melt blend of the polymer 11 and the dichroic dye 12. The melt blend may be prepared by melt-blending the polymer 11 and the dichroic dye 12 at a temperature of greater than or equal to the melting point of the polymer.

For example, the color polarizing film 10 may be prepared by melt-blending the polymer 11 and the dichroic dye 12 and elongating the same.

In an embodiment, the color polarizing film 10 may be, for example, manufactured by a process including melt-blending the polymer and the dichroic dye to prepare a melt blend, placing the melt-blend into a mold and pressing it into a sheet, and elongating the sheet in a uniaxial direction.

The melt-blending of the polymer and the dichroic dye may be performed at a temperature of less than or equal to about 300° C., for example, ranging from about 50° C. to about 300° C.

The sheet may be formed by placing the melt blend in the mold, and pressing it with a high pressure or discharging it in a chill roll through a T-die.

The elongation in a uniaxial direction may be performed at a temperature ranging from about 30° C. to about 200° C. at an elongation rate ranging from about 300% to about 1,500%. The elongation rate refers to a length ratio of after the elongation to before the elongation of the sheet, and means the elongation extent of the sheet after uniaxial elongation. The elongating in a uniaxial direction may be performed in a dry or wet process.

The color polarizing film 10 may have a relatively low thickness of less than or equal to about 40 micrometers (μm), for example, about 15 μm to about 30 μm. While not wishing to be bound by theory, it is understood that when the color polarizing film 10 has a thickness within the above ranges, it may be significantly thinner than a polarizing plate requiring a protecting plate such as triacetyl cellulose (TAC), and may contribute to realizing a thin display device.

The color polarizing film 10 may have a dichroic ratio of about 2 to about 14 at a wavelength of about 450 nm to about 550 nm, wherein the dichroic ratio may be obtained from Equation 1.

$$DR = \text{Log}(1/T_{195})/\text{Log}(1/T_{//}) \qquad \text{Equation 1}$$

In Equation 1,

DR is a dichroic ratio of the color polarizing film 10, $T_{\parallel}$ is light transmittance of light entering parallel to the transmissive axis of the color polarizing film 10, and $T_{\perp}$ is light transmittance of light entering perpendicular to the transmissive axis of the color polarizing film 10.

The color polarizing film 10 may have a dichroic ratio from about 2 to about 14 at a wavelength of about 380 nm to about 650 nm, wherein the dichroic ratio may be obtained from Equation 1.

Hereinafter, a color polarizing film according to another embodiment is described referring to FIG. 2.

Figure 2:
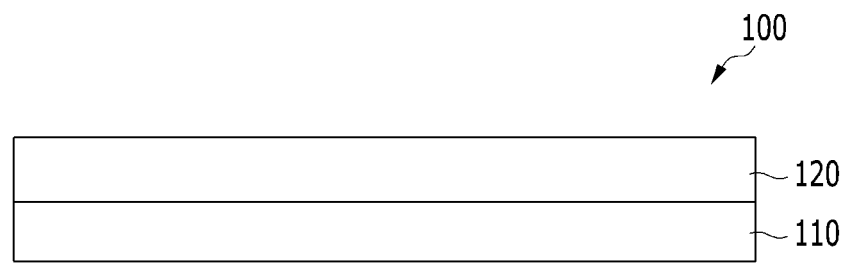
FIG. 2 is a schematic view showing a color polarizing film according to another embodiment.

FIG. 2 is a schematic view showing a color polarizing film according to another embodiment.

Referring to FIG. 2, the color polarizing film 100 includes: a first layer 110 including a first polymer and a dichroic dye having an absorption wavelength region of about 380 nm to about 780 nm 110; and a second layer 120 disposed on the first layer 110, wherein the second layer 120 includes a second polymer and a dye selected from a dichroic dye having an absorption wavelength region of about 380 nm to about 780 nm, a non-dichroic dye having an absorption wavelength region of about 380 nm to about 780 nm, and a combination thereof, wherein the first layer 110 and the second layer 120 are combined to exhibit a maximum absorption wavelength ($\lambda_{max}$) in a wavelength range of about 380 nm to about 780 nm.

The maximum absorption wavelength ($\lambda_{max}$) is determined when the peak is found as evidence of a full width at half maximum (FWHM) and the peak may be identified at a predetermined wavelength in the absorption graph according to the wavelength of the color polarizing film 100.

In an embodiment, the full width at half maximum (FWHM) of the absorption peak at the maximum absorption wavelength ($\lambda_{max}$) may be less than or equal to about 300 nm, for example, about 100 nm to about 280 nm. While not wishing to be bound by theory, it is understood that within the above ranges, the color polarizing film 100 may realize a desirable color.

The color polarizing film 100 exhibits a maximum absorption wavelength ($\lambda_{max}$) in a wavelength range of about 380 nm to about 780 nm, and thus, realizes a color even in an off-state of a display device when the color polarizing film 100 is applied to the display device.

The dichroic dye of the first layer 110 is dispersed in the first polymer, and is arranged in one direction along an elongation direction of the first polymer. The dichroic dye may transmit one perpendicular polarizing component out of two perpendicular polarizing components in a predetermined wavelength region. Herein, the first polymer is the same as the polymer 11 of the color polarizing film 10 according to the embodiment shown in FIG. 1.

The dichroic dye of the first layer 110 may include one dichroic dye or more dichroic dyes having the same or different absorption wavelength regions.

The dichroic dye of the first layer 110 may include at least one, for example, two or more, of a first dichroic dye (A) having a maximum absorption wavelength in a wavelength range of about 380 nm to about 500 nm, a second dichroic dye (B) having a maximum absorption wavelength in a wavelength range of greater than about 500 nm and less than or equal to about 580 nm, and a third dichroic dye (C) having a maximum absorption wavelength in a wavelength range of greater than about 580 nm and less than or equal to about 780 nm.

In addition, the dichroic dye of the first layer 110 may include at least one dichroic dye selected from each first dichroic dye, each second dichroic dye, and each third dichroic dye.

The first dichroic dye may include at least one of a first dichroic dye (A1) having a maximum absorption wavelength in a wavelength range of about 380 nm to about 400 nm and a first dichroic dye (A2) having a maximum absorption wavelength in a wavelength range of greater than about 400 nm and less than or equal to about 500 nm. The second dichroic dye (B) may include at least one of a second dichroic dye (B1) having a maximum absorption wavelength in a wavelength range of greater than about 500 nm and less than or equal to about 560 nm and a second dichroic dye (B2) having a maximum absorption wavelength in a wavelength range of greater than about 560 nm and less than or equal to about 580 nm. The third dichroic dye (C) may include at least one of a third dichroic dye (C1) having a maximum absorption wavelength in a wavelength range of greater than about 580 nm and less than or equal to about 620 nm and a third dichroic dye (C2) having a maximum absorption wavelength in a wavelength range of greater than about 620 nm and less than or equal to about 780 nm.

The first layer 110 of the color polarizing film 100 may include at least one, for example, at least two, dichroic dyes among the first dichroic dye, the second dichroic dye, and the third dichroic dye, but may not include all three varieties of the first dichroic dye, the second dichroic dye, and the third dichroic dye in order to realize a desirable color. When including all of the first dichroic dye, the second dichroic dye, and the third dichroic dye, a neutral gray film may be obtained. Thus, the first layer 110 of the color polarizing film 100 for providing a variety of colors may not include all of the first dichroic dye, the second dichroic dye, and the third dichroic dye. The first dichroic dye, the second dichroic dye, and the third dichroic dye may be, for example, a yellow dye, a magenta dye, and a cyan dye, respectively, but are not limited thereto.

For example, the first layer 110 may include: at least one first dichroic dye selected from the first dichroic dye (A1) and the first dichroic dye (A2) and at least one second dichroic dye selected from the second dichroic dye (B1) and the second dichroic dye (B2); at least one first dichroic dye selected from the first dichroic dye (A1) and the first dichroic dye (A2) and at least one third dichroic dye selected from the third dichroic dye (C1) and the third dichroic dye (C2); or at least one second dichroic dye selected from the second dichroic dye (B1) and the second dichroic dye (B2) and at least one third dichroic dye selected from the third dichroic dye (C1) and the third dichroic dye (C2).

The dichroic dye may be, for example, an azo group-containing compound, for example, an azo-based compound represented by Chemical Formula 1. The azo-based compound represented by Chemical Formula 1 is the same as described in the color polarizing film 10 shown in FIG. 1.

The first layer 110 of the color polarizing film 100 may include the dichroic dye in an amount of about 0.01 to about 10 parts by weight, for example, about 0.05 to about 5 parts by weight, based on 100 parts by weight of the first polymer. While not wishing to be bound by theory, it is understood that within the above ranges, sufficient polarization characteristics and color characteristics may be accomplished without deterioration of the light transmittance of the color polarizing film 100.

The first layer 110 of the color polarizing film 100 may be made of a melt blend of the first polymer and the dichroic dye. The melt blend may be prepared by melt-blending the first polymer and the dichroic dye at a temperature of greater than or equal to the melting point of the first polymer.

The second layer 120 of the color polarizing film 100 may be a lamination film or a coating layer on the first layer 110. The second layer 120 includes a second polymer and a dye selected from a dichroic dye having an absorption wavelength region of about 380 nm to about 780 nm, a non-dichroic dye having an absorption wavelength region of about 380 nm to about 780 nm, and a combination thereof.

In an embodiment, when the second layer 120 is a lamination film, the second polymer may be a hydrophobic polymer, wherein the hydrophobic polymer is the same polymer as described in the first layer 110.

In addition, when the second layer 120 is a coating layer, the second polymer may be a hydrophobic polymer, a photocurable polymer, a thermosetting polymer, or a combination thereof, wherein the photocurable polymer may be selected from a urethane acrylate polymer, a urethane methacrylate polymer, an epoxy acrylate polymer, an epoxy methacrylate polymer, a polyester acrylate, a polyester methacrylate, and a combination thereof, and wherein the thermosetting polymer may be selected from a melamine polymer, a urethane polymer, an acrylic polymer, and a combination thereof.

The dichroic dye or the non-dichroic dye of the second layer 120 may include at least one selected from a first dichroic dye or a first non-dichroic dye (A) having a maximum absorption wavelength in a wavelength range of about 380 nm to about 500 nm, a second dichroic dye or a second non-dichroic dye (B) having a maximum absorption wavelength in a wavelength range of greater than about 500 nm and less than or equal to about 580 nm, and a third dichroic dye or a third non-dichroic dye (C) having a maximum absorption wavelength in a wavelength range of greater than about 580 nm and less than or equal to about 780 nm.

The dichroic dye may be at least one selected from the first dichroic dye, the second dichroic dye, and the third dichroic dye, and the non-dichroic dye may be at least one selected from the first non-dichroic dye, the second non-dichroic dye, and the third non-dichroic dye.

In order to realize a desirable color, the second layer 120 may not include all of the first dichroic dye or the first non-dichroic dye, the second dichroic dye or the second non-dichroic dye, and the third dichroic dye or the third non-dichroic dye.

The dichroic dye of the second layer 120 is the same as described in the dichroic dye of the above-described first layer 110. It is selected so that the first layer 110 is associated with the second layer 120 to exhibit a maximum absorption wavelength ($\lambda_{max}$) within the range of about 380 nm to about 780 nm. The maximum absorption wavelength ($\lambda_{max1}$) of the first layer 110 may be the same as or different from the maximum absorption wavelength ($\lambda_{max2}$) of the second layer 120.

The non-dichroic dye of the second layer 120 refers to a dye having substantially no dichroic ratio, for example, having a dichroic ratio of less than about 1. Specific examples thereof may be an azo-dye, a reactive dye, and an acidic dye, but are not limited thereto.

According to an embodiment, the first layer 110 may include a first dye selected from a first dichroic dye, a second dichroic dye, and a combination thereof, and the second layer 120 may include a second dye selected from a first dichroic dye or a first non-dichroic dye, second dichroic dye or a second non-dichroic dye, and a combination thereof.

According to an embodiment, the first layer 110 may include a first dye selected from a second dichroic dye, a third dichroic dye, and a combination thereof, and the second layer 120 may include a second dye selected from a second dichroic dye or a second non-dichroic dye, a third dichroic dye or a third non-dichroic dye, and a combination thereof.

The second layer 120 may be prepared by laminating a separately-obtained film for the second layer 120 on the first layer 110 or coating a liquid composition for the second layer 120 on the first layer 110.

The method of providing a color polarizing film 100 by the lamination may include: melt-blending a first polymer and a first dichroic dye to provide a first melt blend; pressing the first melt blend to provide a first sheet, and then, elongating the same in an uniaxial direction to provide a first layer 110; melt-blending a second polymer and a second dichroic dye to provide a second melt blend; pressing the second melt blend to provide a second sheet, and then, elongating the same in a uniaxial direction to provide a second layer 120; and combining the first layer 110 with the second layer 120.

The first melt blend and the second melt blend may be prepared by melt-blending the polymer (first polymer or second polymer) and the dichroic dye (first dichroic dye or second dichroic dye), for example, at less than or equal to about 300° C., for example, about 50° C. to about 300° C.

The first sheet and the second sheet may be prepared by positioning the melt blend (first melt blend or second melt blend) of the polymer (first polymer or second polymer) and the dichroic dye (first dichroic dye or second dichroic dye) into the mold and pressing the same with a press under a high pressure, or by discharging the same into a chill roll through a T-die or by extruding the same.

The combining of the first layer 110 with the second layer 120 may be performed by interposing an adhesive between the first layer 110 and the second layer 120. The adhesive may include a polyvinyl alcohol-based adhesive, a urethane emulsion-based adhesive, an acryl-based adhesive, a polyester-isocyanate-based adhesive, or the like.

In addition, the first melt blend of the first polymer of first layer 110 and the first dye and the second melt blend of the second polymer and the second dye may be coextruded, and then, elongated to provide a color polarizing film 100.

The method of preparing a color polarizing film 100 by the coating process may include: melt-blending a first polymer and a dichroic dye to provide a melt blend; pressing the melt blend to provide a first sheet, and then, elongating the same in a uniaxial direction to provide a first layer 110; coating a liquid composition including a second polymer and a second dye on the first layer; and photo-curing or thermal-curing the same to provide a second layer.

The liquid composition of the second layer 120 may include: about 5 to about 60 wt % of a photocurable compound selected from a photocurable monomer, oligomer, and polymer; about 0.01 to about 10 wt % of a second dye selected from a dichroic dye, a non-dichroic dye, and a combination thereof; about 0.01 to about 5 wt % of a photoinitiator; and the balance of a solvent.

The liquid composition of the second layer 120 may include: about 15 to about 74 wt % of a thermosetting compound selected from a thermosetting monomer, a thermosetting oligomer and a thermosetting polymer; about 0.01 to about 10 wt % of a second dye selected from a dichroic dye, a non-dichroic dye, and a combination thereof; about 0.01 to about 10 wt % of a hardener; and the balance of a solvent.

The second dye of the second layer 120 selected from a dichroic dye, a non-dichroic dye and a combination thereof may be included at about 0.01 to about 10 parts by weight, for example, about 0.05 to about 5 parts by weight, based on 100 parts by weight of the second polymer. While not wishing to be bound by theory, it is understood that within the above range, the second dye may show sufficient color characteristics without deterioration of the light transmittance of the second layer 120.

The elongating in a uniaxial direction may be performed at a temperature of about 30° C. to about 200° C. and at an elongation rate of about 300% to about 1,500%. The elongation rate refers to a length ratio of after the elongation to before the elongation of the sheet, and means the elongation extent of the sheet after uniaxial elongation. The elongating in a uniaxial direction may be performed in a dry or wet process.

The first layer 110 of the color polarizing film 100 may have a relatively low thickness of less than or equal to about 30 μm, for example, about 15 μm to about 20 μm, and the second layer 120 may have a relatively low thickness of less than or equal to about 30 μm, for example, about 5 μm to about 20 μm. Thereby, the color polarizing film 100 may have a relatively low thickness of less than or equal to about 40 μm, for example, about 20 μm to about 40 μm. While not wishing to be bound by theory, it is understood that when the color polarizing film 100 has a thickness within the above ranges, it may be significantly thinner than a polarizing plate requiring a protecting plate such as triacetyl cellulose (TAC), and may contribute to realizing a thin display device.

The first layer 110 may have light transmittance of about 30% to about 85%, for example, about 40% to about 85%, about 30% to about 65% or about 40% to about 60%, and the second layer 120 may have light transmittance of greater than or equal to about 30%, for example, about 35% to about 75% or about 35% to about 50%. In this case, a rate ($T_1/T_2$) of the light transmittance (T1) of the first layer 110 to the light transmittance (T2) of the second layer 120 may range from about 0.35 to about 2.9, for example, from about 0.3 to about 2.3, from about 0.8 to about 2.4, or from about 0.5 to about 1.5. While not wishing to be bound by theory, it is understood that within the above ranges, it may contribute to realizing a desirable color while reducing the reflectance of the color polarizing film 100.

The polarization efficiency of the color polarizing film 100 may range from about 85% to about 99%, for example, from about 89% to about 99%, and the light transmittance of the polarizing film may range from about 30% to about 85%, for example, from about 40% to about 85%. While not wishing to be bound by theory, it is understood that when the polarization efficiency and the light transmittance are within the above ranges, the light emission in the display device may not be interrupted when the color polarizing film 100 is applied to one surface of the display device.

At a wavelength of about 450 nm to 550 nm, the color polarizing film 100 may have a dichroic ratio of about 2 to about 14, wherein the dichroic ratio may be obtained from Equation 1.

$$DR = \log(1/T_{195})/\log(1/T_{//}) \qquad \text{Equation 1}$$

In Equation 1,

DR is a dichroic ratio of the color polarizing film 100, $T_{\parallel}$ is light transmittance of light entering parallel to the transmissive axis of the color polarizing film 100, and $T_{\perp}$ is light transmittance of light entering perpendicular to the transmissive axis of the color polarizing film 100.

At a wavelength of about 380 nm to 650 nm, the color polarizing film 100 may have a dichroic ratio of about 2 to about 14, wherein the dichroic ratio may be obtained from Equation 1.

The dichroic ratio refers to how the dichroic dye is arranged in parallel in one direction in the color polarizing film 100. As the color polarizing film 100 has the ranged dichroic ratio within a predetermined wavelength range, it may induce the alignment of the dichroic dye according to the alignment of a polymer chain, so as to improve the polarization characteristics while reducing the reflectance to less than or equal to about 10%.

The first layer 110 of the color polarizing film 100 may be made of a melt blend of a first polymer and a dichroic dye, wherein the melt blend may be obtained by mixing the first polymer and the dichroic dye at a temperature of greater than or equal to the melting point of the first polymer. The melt-blending of the first polymer and the dichroic dye may be performed at a temperature of less than or equal to about 300° C., for example, ranging from about 50° C. to about 300° C.

The second layer 120 of the color polarizing film 100 includes a second dye selected from a dichroic dye, a non-dichroic dye, and a combination thereof, which is dispersed in a second polymer. In the second layer 120, the second dye is dispersed in a cross-linking matrix of the second polymer.

The color polarizing film 10 or 100 may further include a protective layer on one or both surfaces thereof. The protective layer may be made of cellulose acetate, an acryl-based polymer, a methacryl-based polymer, a polyester polymer, a polyolefin polymer, or a polyamide-based polymer, and specific examples thereof may include triacetyl cellulose (TAC) or a cycloolefin-based polymer.

The color polarizing film 10 or 100 may be applied to a smart watch, a laptop computer, a liquid crystal projector, a liquid crystal television, an electronic calculator, a word processor, a car navigator, and the like, which may provide a color sense to the display image.

Figure 3:
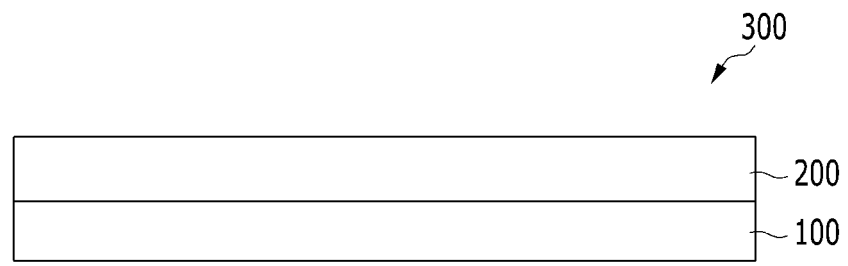
FIG. 3 is a schematic view showing an antireflective film according to an embodiment.

FIG. 3 is a schematic view showing an antireflective film according to an embodiment. Referring to FIG. 3, an antireflective film 300 according to an embodiment includes a compensation film 200 and a color polarizing film 10 or 100 disposed on one surface of the compensation film 200. The compensation film 200 may be a retardation film, for example, a π/4 plate. The compensation film 200 may circularly-polarized light passed through the color polarizing film 10 or 100 to generate retardation, and may influence reflection and/or absorption of light.

The antireflective film 300 may be mounted on one or both surfaces of a display device, and particularly, may prevent light flowing into the display part of the display device from the outside from being reflected (hereinafter referred to as "external light reflection"). Accordingly, the antireflective film 300 may prevent visibility deterioration caused by the external light reflection.

Figure 4:
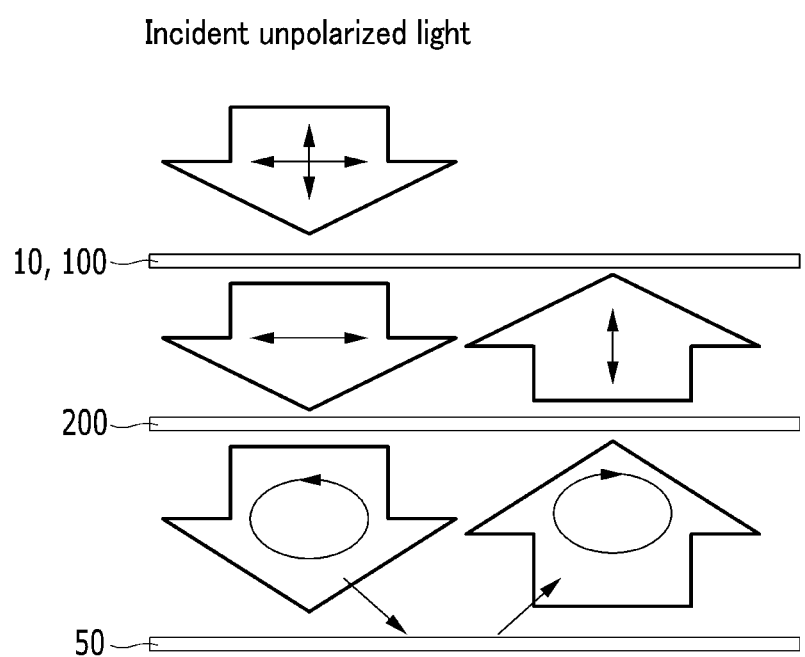
FIG. 4 is a schematic view showing the anti-reflection principle of a color polarizing film.

FIG. 4 is a schematic view showing the anti-reflection principle of a color polarizing film.

Referring to FIG. 4, the incident non-polarized light having entered from the outside is passed through the color polarizing film 10 or 100 and the polarized light is shifted into circularly polarized light by passing through the compensation film 200, for example, a λ/4 plate. While the circularly polarized light is reflected in a display panel 50 including a substrate, an electrode, and so on, and the circular polarization direction is changed, and the circularly polarized light is passed through the compensation film 200 again, only a second polarized perpendicular component, which is the other polarized perpendicular component of the two polarized perpendicular components, may be transmitted. As the second polarized perpendicular component is not passed through the color polarizing film 10 or 100, and light does not exit to the outside, effects of preventing the external light reflection may be provided.

The color polarizing film 10 or 100 and the antireflective film 300 may be applied to various display devices.

The display device may be, for example, an organic light emitting diode (OLED) display or a liquid crystal display (LCD), but is not limited thereto.

A display device according to an embodiment includes a display panel and the antireflective film on at least one surface of the display panel.

The display panel may include, for example, two substrates facing each other with an active layer disposed therebetween, and for example, may include a liquid crystal panel or an organic light emitting panel.

The antireflective film includes the compensation film and the polarizing film as described above, the compensation film may be, for example, a retardation film such as a λ/4 plate as described above, and the color polarizing film is the same as described above.

Hereinafter, an organic light emitting diode (OLED) display as one example of the display device is described.

Figure 5:
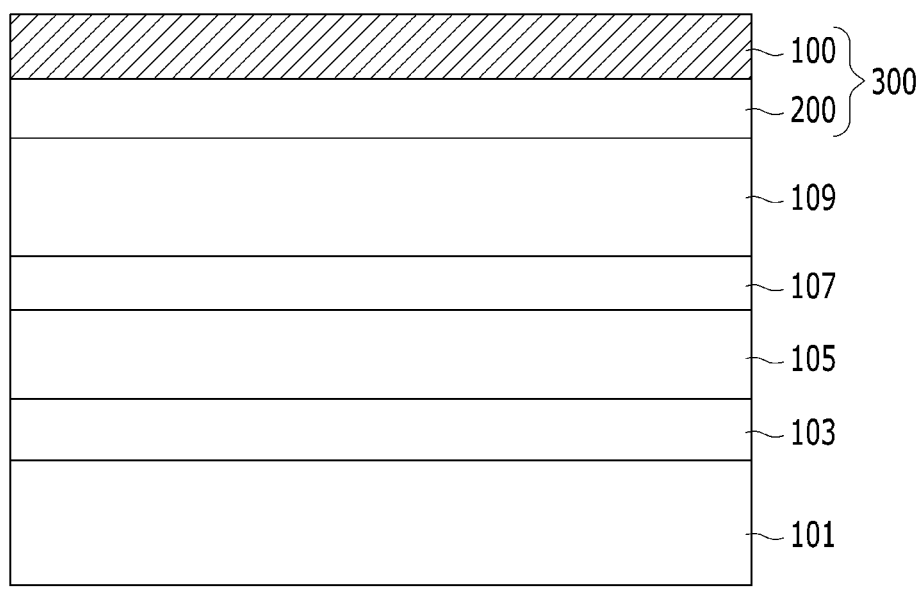
FIG. 5 is a cross-sectional view schematically showing an organic light emitting diode (OLED) display according to an embodiment.

FIG. 5 is a cross-sectional view schematically showing an organic light emitting diode (OLED) display according to an embodiment.

Referring to FIG. 5, an organic light emitting diode (OLED) display according to an embodiment includes a base substrate 101, a lower electrode 103, an organic emission layer 105, an upper electrode 107, an encapsulation substrate 109, and an antireflective film 300. The antireflective film 300 includes the compensation film 200 and the color polarizing film 100 as described above.

The base substrate 101 may be made of a silicon wafer, glass, plastic, and the like.

Either of the lower electrode 103 or the upper electrode 107 may be an anode, while the other one may be a cathode. The anode is an electrode where holes are injected, and is formed of a transparent conductive material having a high work function and externally transmitting entered light, for example, ITO or IZO. The cathode is an electrode where electrons are injected, which is formed of a conducting material having a low work function and having no influence on an organic material. The cathode is selected from, for example, aluminum (Al), calcium (Ca), and barium (Ba).

The organic emission layer 105 includes an organic material emitting light when a voltage is applied between the lower electrode 103 and the upper electrode 107.

An auxiliary layer (not shown) may be further included between the lower electrode 103 and the organic emission layer 105 and between the upper electrode 107 and the organic emission layer 105. The auxiliary layer may include a hole transport layer, a hole injection layer, an electron injection layer, and an electron transport layer for balancing electrons and holes.

The encapsulation substrate 109 may be made of glass, metal, or a polymer. The lower electrode 103, the organic emission layer 105, and the upper electrode 107 are sealed to prevent moisture and/or oxygen from permeating.

The antireflective film 300 may be disposed at a light-emitting side. For example, the antireflective film 300 may be disposed outside of the base substrate 101 in a bottom emission type in which light emits from the base substrate 101, outside of the encapsulation substrate 109 in a top emission type in which light emits from the encapsulation substrate 109, and outside both of the base substrate 101 and the encapsulation substrate 109 in a both-side emission type in which light emits from the base substrate 101 and the encapsulation substrate 109.

The antireflective film 300 includes the compensation film 200 and the color polarizing film 100 as described above. The color polarizing film 100 can be replaced by the color polarizing film 10 as described above.

Hereinafter, the present disclosure is illustrated in more detail with reference to examples. However, these examples are exemplary, and the present disclosure is not limited thereto.

EXAMPLES

Example 1: Manufacture of Color Polarizing Film 0.5 parts by weight of a dichroic dye (cyan, $\lambda_{max}$=595 nm) represented by Chemical Formula 1-1 is mixed with 100 parts by weight of a polymer including polypropylene (PP, HF351 Samsung Total Petrochemicals Co., Ltd.) and a polypropylene-polyethylene copolymer (PP-PE, RP5050, Polymirae Co., Ltd.) at 50:50 (weight to weight, w/w) to prepare a composition.

Chemical Formula 1-1

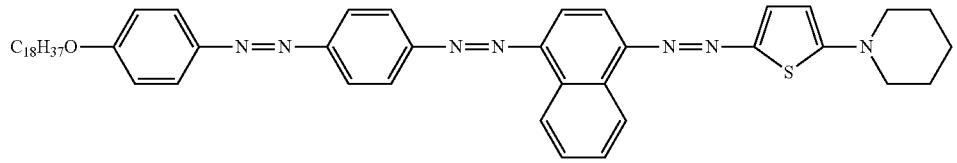

The composition is melt-blended at about 230° C. using a Micro-compounder manufactured by DSM. The melt blend is positioned in a sheet-shaped mold and pressed with a press under a high pressure at a high temperature to provide a sheet. Subsequently, the sheet is elongated in a uniaxial direction (using a tension tester manufactured by Instron) at a rate of 1,100% at 115° C. to provide a color polarizing film having a monolayer.

Example 2: Manufacture of Color Polarizing Film 0.5 parts by weight of a dichroic dye (cyan, $\lambda_{max}$=595 nm) represented by Chemical Formula 1-1 which is used in Example 1 is mixed with 100 parts by weight of a polymer including polypropylene (PP, HF351 Samsung Total Petrochemicals Co., Ltd.) and a polypropylene-polyethylene copolymer (PP-PE, RP5050, Polymirae Co., Ltd.) at 50:50 (w/w) to prepare a first composition.

A second composition including 34.8 percent by weight (wt %) (solid content) of a thermosetting polymer HT1335 (Samwha Paints), 1 wt % of N-AC1 (manufactured by Nematel, $\lambda_{max}$=666 nm), 9 wt % of an H-AL (Teijin Chemical) thermosetting agent, and 55.2 wt % of a solvent, which is a mixed solvent of methyl ethyl ketone and toluene (volume ratio of 6/4), is prepared.

The first composition is melt-blended at about 230° C. using a Micro-compounder manufactured by DSM. The melt blend is positioned in a sheet-shaped mold and pressed with a press under a high pressure at a high temperature to provide a sheet. Subsequently, the sheet is elongated in a uniaxial direction (using a tension tester manufactured by Instron) at a rate of 1,100% at 115° C. to provide a first layer.

The first layer undergoes a corona treatment (250 doses) and is coated with a second composition and dried at 85° C. for 5 minutes (min), and then, aged at 25° C. for 24 hours (h) to provide a second layer.

Example 3: Manufacture of Color Polarizing Film

A color polarizing film is prepared in accordance with the same procedure as in Example 2, except that the content of N-AC1 (manufactured by Nematel, $\lambda_{max}$=666 nm) in the second composition of Example 2 is changed to 3 wt %.

Example 4: Manufacture of Color Polarizing Film

A color polarizing film is prepared in accordance with the same procedure as in Example 2, except that the content of N-AC1 (manufactured by Nematel, $\lambda_{max}$=666 nm) in the second composition of Example 2 is changed to 5 wt %

Example 5: Manufacture of Color Polarizing Film 0.5 parts by weight of a dichroic dye (magenta, $\lambda_{max}$=565 nm) represented by Chemical Formula 2-1 is mixed with 100 parts by weight of a polymer including polypropylene (PP, HF351 Samsung Total Petrochemicals Co., Ltd.) and a polypropylene-polyethylene copolymer (PP-PE, RP5050, Polymirae Co., Ltd.) at 50:50 (w/w) to prepare a first composition. 0.5 parts by weight of a dichroic dye (yellow, $\lambda_{max}$=385 nm) represented by Chemical Formula 2-2 is mixed with 100 parts by weight of a polymer including a polypropylene (PP) and polypropylene-polyethylene copolymer (PP-PE) at 50:50 (w/w) to prepare a second composition.

uniaxial direction (using a tension tester manufactured by Instron) at a rate of 1,100% at 115° C. to provide a first layer.

The second composition is melt-blended at about 230° C. using a Micro-compounder manufactured by DSM. The melt blend is positioned in a sheet-shaped mold and pressed with a press under a high pressure at a high temperature to provide a sheet. Subsequently, the sheet is elongated in a uniaxial direction (using a tension tester manufactured by Instron) at a rate of 1,100% at 115° C. to provide a second layer.

The obtained first layer and second layer are attached using a pressure sensitive adhesive (PL8540, SAIDEN CHEMICAL) to provide a color polarizing film.

Comparative Example 1: Manufacture of Black Polarizing Film 0.1 parts by weight of a dichroic dye (yellow, $\lambda_{max}$=385 nm) represented by Chemical Formula 1A, 0.114 parts by weight of a dichroic dye (yellow, $\lambda_{max}$=455 nm) represented by Chemical Formula 1B, 0.143 parts by weight of a dichroic dye (red, $\lambda_{max}$=565 nm) represented by Chemical Formula 1C, and 0.143 parts by weight of a dichroic dye (blue, $\lambda_{max}$=600 nm) represented by Chemical Formula 1D are mixed into 100 parts by weight of a polymer including polypropylene (PP, HF351 Samsung Total Petrochemicals Co., Ltd.) and a polypropylene-polyethylene copolymer (PP-PE, RP5050, Polymirae Co., Ltd.) at 50:50 (w/w) to provide a composition. The composition is melt-blended at about 230° C. using a Micro-compounder manufactured by DSM. The melt blend is positioned in a sheet-shaped mold

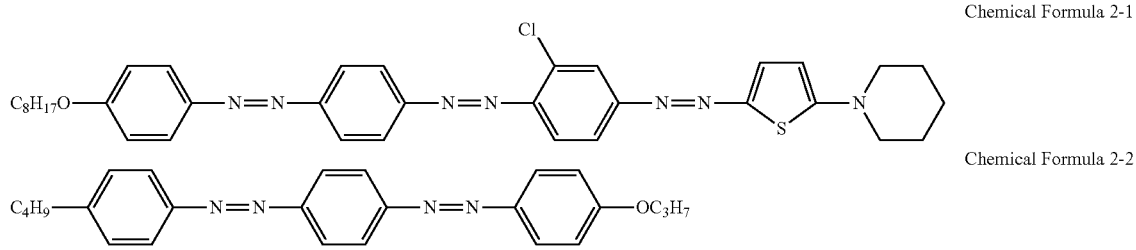

Chemical Formula 2-1

Chemical Formula 2-2

The first composition is melt-blended at about 230° C. using a Micro-compounder manufactured by DSM. The melt blend is positioned in a sheet-shaped mold and pressed with a press under a high pressure at a high temperature to provide a sheet. Subsequently, the sheet is elongated in a and pressed with a press under a high pressure at a high temperature to provide a sheet. Subsequently, the sheet is elongated in a uniaxial direction at a rate of 1,100% (using a tension tester manufactured by Instron) at 115° C. to provide a polarizing film having a monolayer.

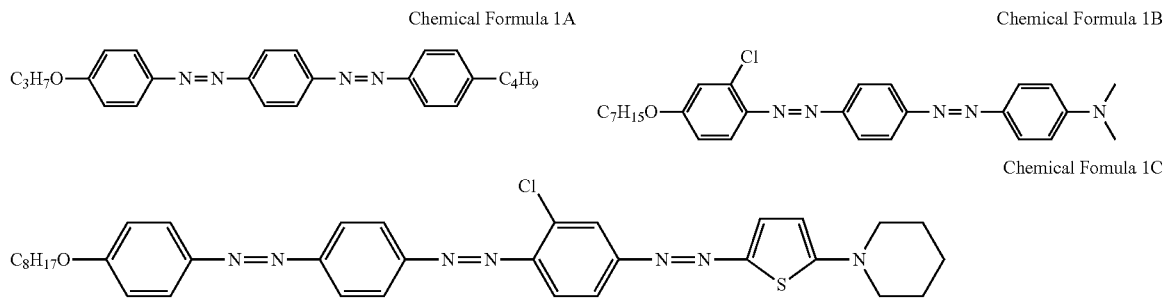

Chemical Formula 1A

Chemical Formula 1B

Chemical Fomula 1C

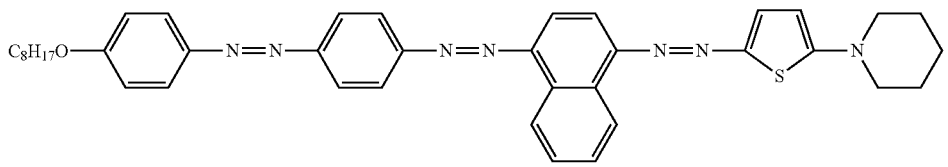

Chemical Formula 1D

Evaluation of Polarizing Film Characteristics

Figure 6:
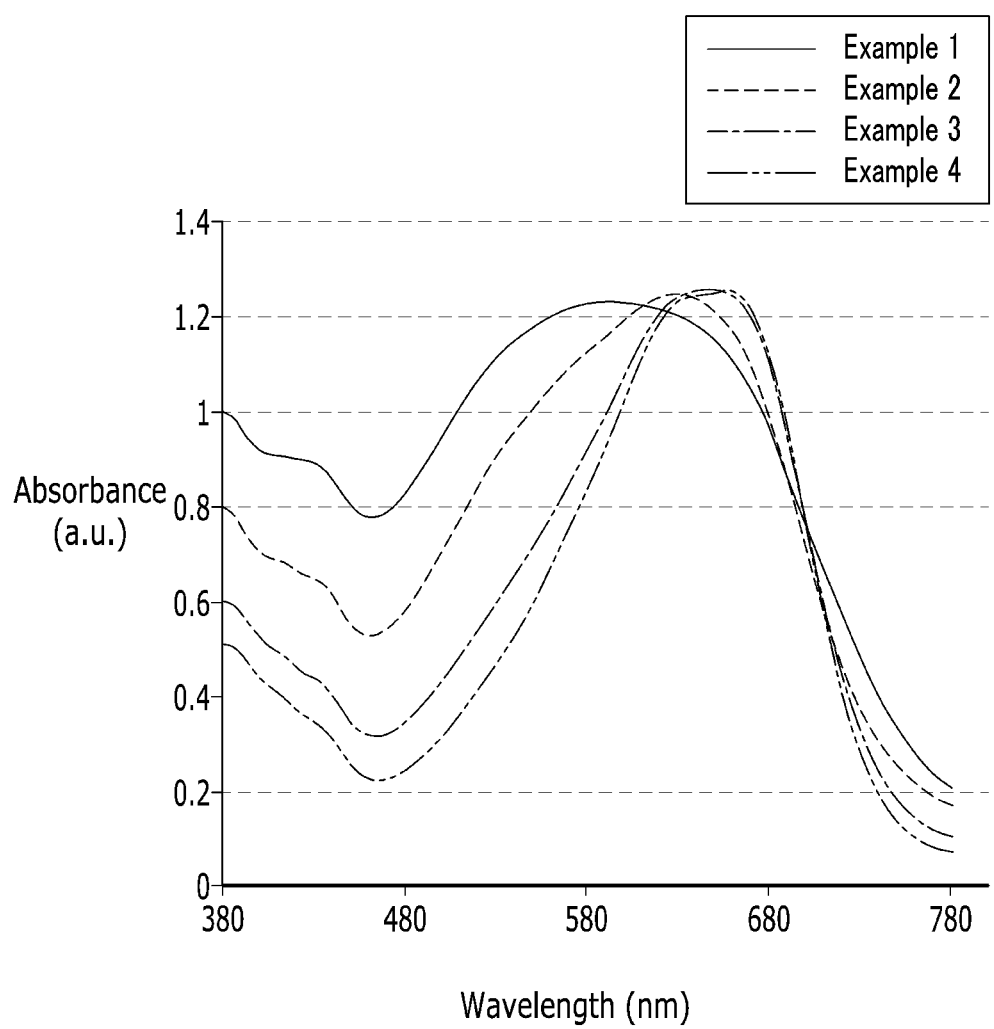
FIG. 6 is a graph of absorbance (arbitrary units, a.u.) versus wavelength (nanometers, nm), showing absorbance depending on a wavelength of the color polarizing films of Examples 1 to 4.
Figure 7:
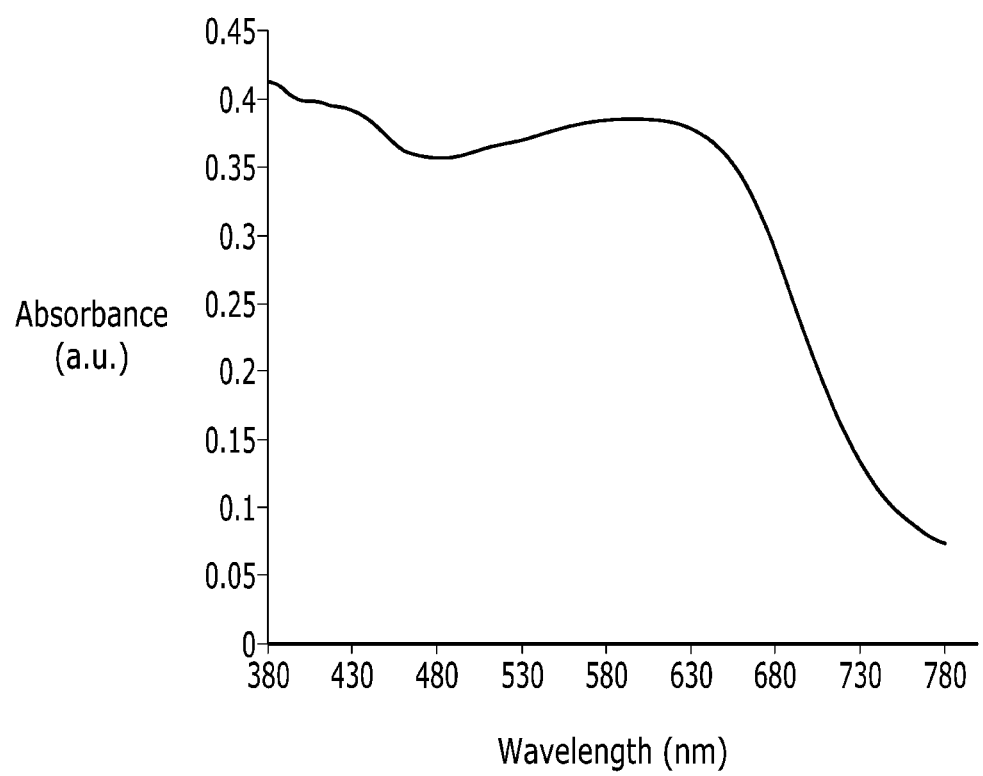
FIG. 7 is a graph of absorbance (arbitrary units, a.u.) versus wavelength (nanometers, nm), showing absorbance depending on a wavelength of the polarizing film of Comparative Example 1.

For the polarizing films obtained from Examples 1 to 4 and Comparative Example 1, absorbance depending on a wavelength is measured by a UV-VIS spectrophotometer (V-7100, JASCO). The results are shown in FIG. 6 and FIG. 7. FIG. 6 shows absorbance depending on a wavelength for the color polarizing films of Examples 1 to 4, and FIG. 7 shows absorbance depending on a wavelength for the polarizing film of Comparative Example 1. Referring to FIG. 6, the color polarizing films obtained from Examples 1 to 4 exhibit maximum absorption wavelengths of 595 nm, 630 nm, 645 nm and 660 nm, respectively; and referring to FIG. 7, the polarizing film obtained from Comparative Example 1 exhibits a nearly flat absorption peak in a visible light region (380 nm to 780 nm), so it is understood that the maximum absorption peak is not found.

For the polarizing films obtained from Examples 1 to 4 and Comparative Example 1, $\lambda_{max}$, a full width at half maximum (FWHM), and transmittance are measured by a UV-VIS spectrophotometer (V-7100, JASCO Inc.), and the color is visually evaluated. The results are shown in Table 1.

As the polarizing film of Comparative Example 1 exhibits a black color and shows a nearly flat absorption peak in a visible light region (380 nm to 780 nm), the maximum absorption peak and the full width at half maximum (FWHM) may not be identified.

Polarization efficiency is obtained by Equation 2.

$$PE(\%)=[(T_{//}-T_{\perp})/(T_{//}+T_{195})]^{1/2} \times 100 \quad \text{Equation 2}$$

In Equation 2,

PE is polarization efficiency of the polarizing film, $T_{//}$ is light transmittance of the polarizing film with respect to light entering parallel to the transmissive axis, and $T_{\perp}$ is light transmittance of the polarizing film with respect to light entering perpendicular to the transmissive axis.

$T_{//}$ and $T_{\perp}$ are measured using a UV-VIS spectrophotometer (JASCO, V-7100).

TABLE 1

| | $\lambda_{max}$ | Full width at half maximum (FWHM) | Color | Transmittance (Ts, %) | Polarization efficiency (PE, %) |
|---|---|---|---|---|---|
| Example 1 | 595 nm | 255 nm | Purple | 41.7 | 93.7 |
| Example 2 | 630 nm | 255 nm | Blue | 40.8 | 94.6 |
| Example 3 | 645 nm | 265 nm | Medium color between blue and sky blue | 38.9 | 96.1 |
| Example 4 | 660 nm | 270 nm | Sky blue | 37.1 | 97.9 |

As shown in Table 1, the color polarizing films obtained from Examples 1 to 4 show a maximum absorption wavelength within a range from 595 nm to 660 nm, and have high polarization efficiency of 93.7% to 97.9%.

Manufacture of Antireflective Film

Example 6 to 10: Manufacture of Antireflective Film

Each color polarizing film obtained from Examples 1 to 5 and a circularly polarized light compensation film (λ/4 plate) are combined to provide antireflective films according to Examples 6 to 10. As the circularly polarized light compensation film, a WRS film manufactured by Teijin is used.

Comparative Example 2: Manufacture of Antireflective Film

An antireflective film is prepared in accordance with the same procedure as in Examples 6 to 10, except that the polarizing film obtained from Comparative Example 1 is used instead of the color polarizing films according to Examples 1 to 5.

Examples 11 to 15: Manufacture of Organic Light Emitting Diode (OLED) Display

A metallic anode, an organic emission layer including a light emitting material, a cathode including a transparent or a semi-transparent conductivity material, and a second substrate are sequentially stacked on a first glass substrate to provide an organic light emitting display panel. Subsequently, the circularly polarized light compensation film of the antireflective film obtained from each of Example 6 to 10 is attached to face the second substrate of the organic light emitting display panel to provide an organic light emitting diode (OLED) display.

Comparative Example 3: Manufacture of Organic Light Emitting Diode (OLED) Display An organic light emitting diode (OLED) display is manufactured in accordance with the same procedure as in Examples 11 to 15, except that the antireflective film obtained from Comparative Example 2 is used instead of the antireflective films obtained from Examples 11 to 15.

While this disclosure has been described in connection with what is presently considered to be practical exemplary embodiments, it is to be understood that the disclosure is not limited to the present embodiments, but, on the contrary, is intended to cover various modifications and equivalent arrangements included within the spirit and scope of the appended claims.

What is claimed is:

1. A display device comprising a color polarizing film comprising:
   a first layer comprising a first polymer and a first dichroic dye having an absorption wavelength region in a region from about 380 nanometers to about 780 nanometers and
   a second layer disposed on, and adjacent to the first layer, wherein the second layer comprises a second polymer and a second dichroic dye having an absorption wavelength region in a region from about 380 nanometers to about 780 nanometers, the second dichroic dye being different from the first dichroic dye,
   wherein the first polymer and the second polymer each have a crystallinity of about 50% or less, and a light transmittance of greater than or equal to about 85% in a wavelength region of about 380 nm to about 780 nm,
   wherein the first polymer is elongated in a uniaxial direction which is the same as a length direction of the first dichroic dye, and the second polymer is elongated in a uniaxial direction which is the same as a length direction of the second dichroic dye,
   wherein the first layer and the second layer are combined to exhibit a single maximum absorption wavelength ($\lambda_{max}$) in a wavelength range of about 380 nanometers to about 780 nanometers,
   wherein the first layer and the second layer are combined to produce a single display color which is realized even when the display device is in an off-state,
   wherein the first layer and the second layer are not neutral gray polarizing layers,
   wherein the absorption peak at the single maximum absorption wavelength ($\lambda_{max}$) has a full width at half maximum of less than or equal to about 300 nanometers,
   wherein the color polarizing film absorbs unpolarized light and produces a single color polarized light,
   wherein the first layer is a melt blend of the first polymer and the first dichroic dye, and the first dichroic dye is configured to provide the melt blend of the first polymer and the first dichroic dye, and
   the second layer is a melt blend of the second polymer and the second dichroic dye, and the second dichroic dye is configured to provide the melt blend of the second polymer and the second dichroic dye.

2. The display device comprising the color polarizing film of claim 1, wherein an absorption peak at the maximum absorption wavelength ($\lambda_{max}$) has a full width at half maximum of about 100 nm to about 250 nm.

3. The display device comprising the color polarizing film of claim 1, wherein a maximum absorption wavelength ($\lambda_{max1}$) in a wavelength range of about 380 nanometers to about 780 nanometers of the first layer is different from a maximum absorption wavelength ($\lambda_{max2}$) in a wavelength range of about 380 nanometers to about 780 nanometers of the second layer.

4. The display device comprising the color polarizing film of claim 1, wherein the second layer is a lamination film or a coating layer.

5. The display device comprising the color polarizing film of claim 1, wherein the first polymer is selected from a polyolefin, a polyamide, a polyester, a polyacrylate, a polymethacrylate, a styrene-based polymer, a polycarbonate, a vinyl chloride-based polymer, a polyimide, a polysulfone, a polyethersulfone, a polyether-ether ketone, a polyphenylene sulfide, a polyvinyl alcohol, a polyvinylidene chloride, a polyvinyl butyral, a polyarylate, a polyoxymethylene, an epoxy polymer, a copolymer thereof, and a combination thereof.

6. The display device comprising the color polarizing film of claim 1, wherein the first polymer is selected from polyethylene, polypropylene, polyethylene terephthalate, polybutylene terephthalate, glycol modified polyethylene terephthalate, polyethylene naphthalate, nylon, a copolymer thereof, and a combination thereof.

7. The display device comprising the color polarizing film of claim 1, wherein the second polymer is a hydrophobic polymer, a photocurable polymer, a thermosetting polymer, or a combination thereof.

8. The display device comprising the color polarizing film of claim 7,
   wherein the photocurable polymer is selected from a urethane acrylate polymer, a urethane methacrylate polymer, an epoxy acrylate polymer, an epoxy methacrylate polymer, a polyester acrylate, a polyester methacrylate, and a combination thereof, and
   wherein the thermosetting polymer is selected from a melamine polymer, a urethane polymer, an acrylic polymer, a methacrylic polymer, and a combination thereof.

9. The display device comprising the color polarizing film of claim 1, wherein the first dichroic dye of the first layer comprises one or more dichroic dyes having the same or different absorption wavelength regions.

10. The display device comprising the color polarizing film of claim 1, wherein the first dichroic dye of the first layer comprises at least one selected from a first dichroic dye (A) having a maximum absorption wavelength in a wavelength range of about 380 nanometers to about 500 nanometers, a second dichroic dye (B) having a maximum absorption wavelength in a wavelength range of greater than about 500 nanometers and less than or equal to about 580 nanometers, and a third dichroic dye (C) having a maximum absorption wavelength in a wavelength range of greater than about 580 nanometers and less than or equal to about 780 nanometers.

11. The display device comprising the color polarizing film of claim 10, wherein the first dichroic dye (A) comprises at least one of a first dichroic dye (A1) having a maximum absorption wavelength in a wavelength range of about 380 nanometers to about 400 nanometers, and a first dichroic dye (A2) having a maximum absorption wavelength in a wavelength range of greater than about 400 nanometers and less than or equal to about 500 nanometers.

12. The display device comprising the color polarizing film of claim 10, wherein the second dichroic dye (B) comprises at least one of a second dichroic dye (B1) having a maximum absorption wavelength in a wavelength range of greater than about 500 nanometers and less than or equal to about 560 nanometers, and a second dichroic dye (B2) having a maximum absorption wavelength in a wavelength range of greater than about 560 nanometers and less than or equal to about 580 nanometers.

13. The display device comprising the color polarizing film of claim 10, wherein the third dichroic dye (C) comprises at least one of a third dichroic dye (C1) having a maximum absorption wavelength in a wavelength range of greater than about 580 nanometers and less than or equal to about 620 nanometers, and a third dichroic dye (C2) having a maximum absorption wavelength in a wavelength range of greater than about 620 nanometers and less than or equal to about 780 nanometers.

14. The display device comprising the color polarizing film of claim 1, wherein the first dichroic dye of the first layer comprises a compound represented by Chemical Formula 1:

Chemical Formula 1

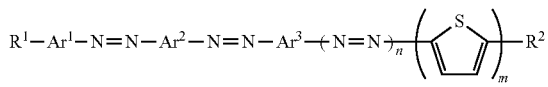

wherein, in Chemical Formula 1,
$Ar^1$ to $Ar^3$ are independently a substituted or unsubstituted C6 to C15 arylene group,
$R^1$ is selected from a substituted or unsubstituted C1 to C30 alkyl group, a substituted or unsubstituted C1 to C20 alkoxy group, a substituted or unsubstituted C1 to C20 alkylthio group, a substituted or unsubstituted C3 to C30 cycloalkyl group, a substituted or unsubstituted C3 to C20 cycloalkoxy group, a substituted or unsubstituted C3 to C20 cycloalkylthio group, —(C=O)R (wherein R is a substituted or unsubstituted C1 to C30 alkyl group or a substituted or unsubstituted C3 to C30 cycloalkyl group), —O(C=O)R (wherein R is a substituted or unsubstituted C1 to C30 alkyl group or a substituted or unsubstituted C3 to C30 cycloalkyl group), —O(C=O)OR (wherein R is a substituted or unsubstituted C1 to C30 alkyl group or a substituted or unsubstituted C3 to C30 cycloalkyl group), a substituted or unsubstituted C2 to C30 alkenyl group, a substituted or unsubstituted C2 to C30 alkynyl group, and a combination thereof,
$R^2$ is selected from hydrogen, a substituted or unsubstituted C1 to C30 alkyl group, a substituted or unsubstituted C3 to C30 cycloalkyl group, a substituted or unsubstituted C6 to C20 aryl group, a substituted or unsubstituted C7 to C20 arylalkyl group, a substituted or unsubstituted C3 to C20 heteroaryl group, a substituted or unsubstituted C4 to C20 heteroarylalkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring,
n is 0, 1, or 2, and
m is 0 or 1.

15. The display device comprising the color polarizing film of claim 1, wherein
the first dichroic dye of the first layer comprises at least one selected from a first dichroic dye (A) having a maximum absorption wavelength in a wavelength range of about 380 nanometers to about 500 nanometers, a second dichroic dye (B) having a maximum absorption wavelength in a wavelength range of greater than about 500 nanometers and less than or equal to about 580 nanometers, and a third dichroic dye (C) having a maximum absorption wavelength in a wavelength range of greater than about 580 nanometers and less than or equal to about 780 nanometers,
the second dichroic dye of the second layer comprises at least one selected from a first dichroic dye (A) having a maximum absorption wavelength in a wavelength range of about 380 nanometers to about 500 nanometers, a second dichroic dye (B) having a maximum absorption wavelength in a wavelength range of greater than about 500 nanometers and less than or equal to about 580 nanometers, and a third dichroic dye (C) having a maximum absorption wavelength in a wavelength range of greater than about 580 nanometers and less than or equal to about 780 nanometers.

16. The display device comprising the color polarizing film of claim 1, wherein the color polarizing film has light transmittance of about 30% to about 85%.

17. The display device comprising the color polarizing film of claim 1, wherein an amount of the first dichroic dye is about 0.01 to about 10 parts by weight based on 100 parts by weight of the first polymer.

18. The display device comprising the color polarizing film of claim 1,
wherein the first layer has light transmittance of about 30% to about 85%, and
wherein the second layer has light transmittance of greater than or equal to about 30%.

19. The display device comprising the color polarizing film of claim 1, wherein a ratio ($T_1/T_2$) of the light transmittance ($T_1$) of the first layer relative to the light transmittance ($T_2$) of the second layer ranges from about 0.35 to about 2.9.

20. An antireflective film comprising:
the color polarizing film of claim 1, and
a compensation film.

21. The antireflective film of claim 20, wherein the compensation film is a λ/4 plate.

22. An organic light emitting diode (OLED) display comprising:
a display panel; and
an antireflective film disposed on at least one surface of the display panel,
wherein the antireflective film comprises a color polarizing film and a compensation film,
wherein the color polarizing film comprises:
a first layer comprising a first polymer and a first dichroic dye having an absorption wavelength region in a region from about 380 nanometers to about 780 nanometers, and
a second layer disposed on, and adjacent to the first layer, wherein the second layer comprises a second polymer and a second dichroic dye having an absorption wavelength region in a region from about 380 nanometers to about 780 nanometers, the second dichroic dye being different from the first dichroic dye,
wherein the first polymer and the second polymer each have a crystallinity of about 50% or less, and a light transmittance of greater than or equal to about 85% in a wavelength region of about 380 nm to about 780 nm,
wherein the first polymer is elongated in a uniaxial direction which is the same as a length direction of the first dichroic dye, and the second polymer is elongated in a uniaxial direction which is the same as a length direction of the second dichroic dye,
wherein the first layer and the second layer are combined to exhibit a single maximum absorption wavelength ($λ_{max}$) in a wavelength range of about 380 nanometers to about 780 nanometers,
wherein the first layer and the second layer are combined to produce a single display color which is realized even when the OLED display is in an off-state,
wherein the first layer and the second layer are not neutral gray polarizing layers,
wherein the absorption peak at the single maximum absorption wavelength ($λ_{max}$) has a full width at half maximum of less than or equal to about 300 nanometers, wherein the color polarizing film absorbs unpolarized light and produces a single color polarized light, wherein the first layer is a melt blend of the first polymer and the first dichroic dye, and the first dichroic dye is configured to provide the melt blend of the first polymer and the first dichroic dye, and the second layer is a melt blend of the second polymer and the second dichroic dye, and the second dichroic dye is configured to provide the melt blend of the second polymer and the second dichroic dye.

* * * * *